(12) United States Patent
Tanaka

(10) Patent No.: US 10,803,962 B1
(45) Date of Patent: Oct. 13, 2020

(54) CURRENT MONITORING IN SEMICONDUCTOR PACKAGES

(71) Applicant: MICRON TECHNOLOGY, INC., Boise, ID (US)

(72) Inventor: Tomoharu Tanaka, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/371,221

(22) Filed: Apr. 1, 2019

(51) Int. Cl.
*G11C 16/30* (2006.01)
*G11C 5/14* (2006.01)
*G11C 16/04* (2006.01)
*G01R 19/10* (2006.01)
*G06F 1/3296* (2019.01)
*G01R 19/165* (2006.01)
*G06F 1/28* (2006.01)

(52) U.S. Cl.
CPC ............. *G11C 16/30* (2013.01); *G01R 19/10* (2013.01); *G01R 19/16571* (2013.01); *G06F 1/28* (2013.01); *G06F 1/3296* (2013.01); *G11C 5/145* (2013.01); *G11C 16/0483* (2013.01)

(58) Field of Classification Search
CPC ..... G01R 19/10; G01R 19/16571; G06F 1/28; G06F 1/3296; G11C 5/145

USPC ............ 365/185.17, 185.21, 185.25, 185.22, 365/185.23
See application file for complete search history.

(56) References Cited

U.S. PATENT DOCUMENTS

| 2008/0239836 A1* | 10/2008 | Thorp ...................... G11C 5/14 365/189.09 |
| 2017/0115710 A1* | 4/2017 | Jain ........................... G06F 1/28 |
| 2018/0241298 A1* | 8/2018 | Reinisch ............... H01F 7/1844 |

\* cited by examiner

*Primary Examiner* — Connie C Yoha
(74) *Attorney, Agent, or Firm* — Dicke, Billig & Czaja, PLLC

(57) ABSTRACT

A semiconductor package includes an external power supply node, a current monitoring node, and a plurality of semiconductor dies. Each semiconductor die of the plurality of semiconductor dies includes a first circuit and a second circuit. The first circuit is configured to supply a first operating current to that semiconductor die from the external power supply node. The second circuit is configured to mirror the first operating current on a reduced scale and output the mirrored first operating current to the current monitoring node. The mirrored first operating current from each semiconductor die of the plurality of semiconductor dies is summed on the current monitoring node.

24 Claims, 10 Drawing Sheets

US 10,803,962 B1

CURRENT MONITORING IN SEMICONDUCTOR PACKAGES

TECHNICAL FIELD

The present disclosure relates generally to peak power management and, in particular, in one or more embodiments, the present disclosure relates to apparatus and methods for peak power management in multi-die semiconductor packages.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, tablet computers, digital cameras, digital media players, cellular telephones, solid state drives and removable memory modules, and the uses are growing.

Multiple semiconductor dies, such as multiple flash memory dies, may be combined into a single semiconductor package or memory device. Each semiconductor die within the semiconductor package may not know the operating state and therefore the current draw of the other semiconductor dies within the semiconductor package. If the total current draw of the semiconductor package exceeds a maximum value, the device may malfunction.

For the reasons stated above, and for other reasons stated below which will become apparent to those skilled in the art upon reading and understanding the present specification, there is a need in the art for alternative methods for managing peak power in a multi-die semiconductor package.

DETAILED DESCRIPTION

Figure 1:
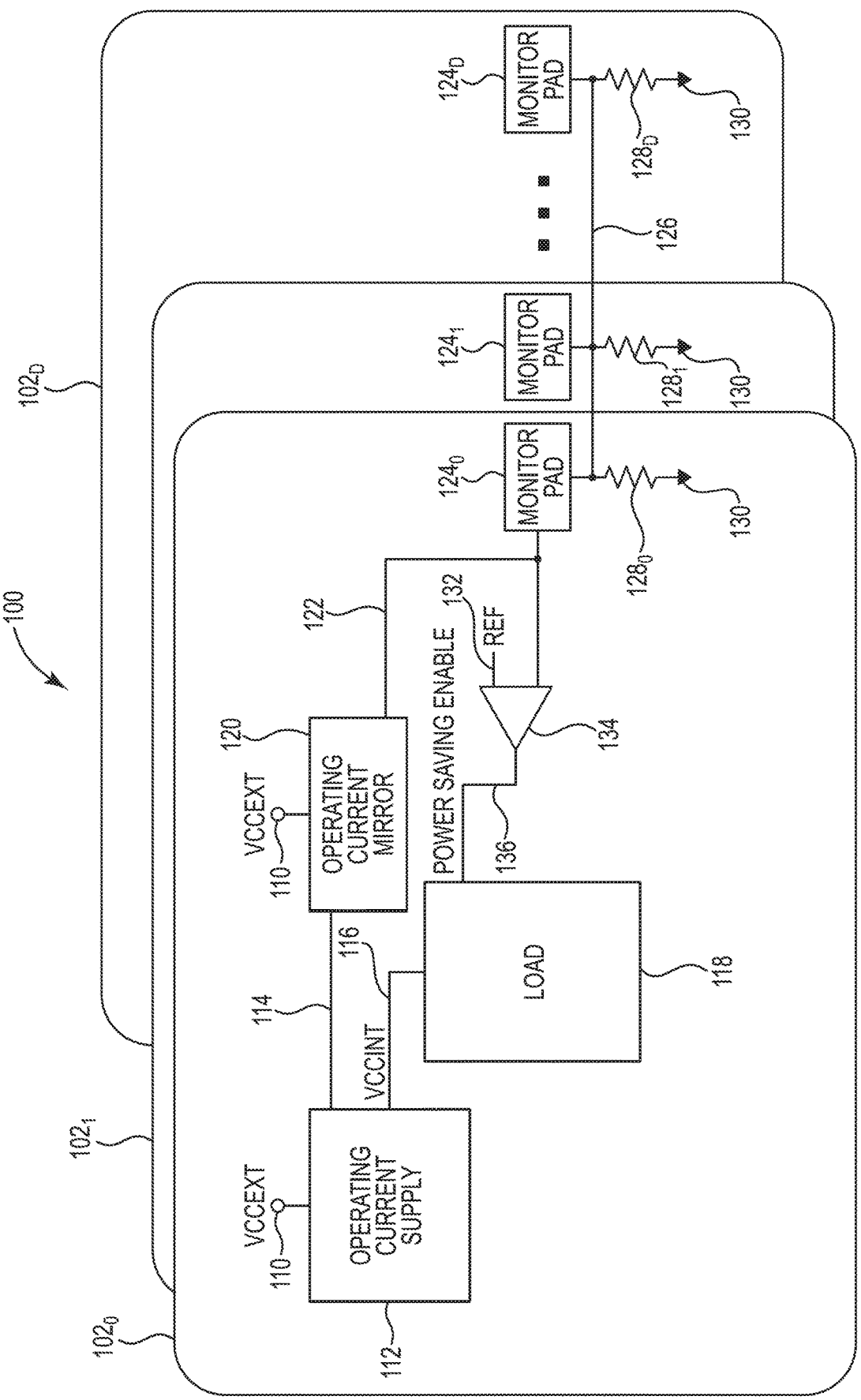
FIG. 1 is a schematic diagram illustrating one example of a multi-die semiconductor package.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Disclosed herein are apparatus and methods for monitoring the total current of a multi-die semiconductor package, such as a memory device. The operating current of each die of the multi-die semiconductor package may be measured and mirrored on a reduced scale. The mirrored current of each die of the multi-die semiconductor package may be summed on a monitor pad (e.g., node) that is shared by each die such that each die may receive an indication of the total operating current being supplied to the semiconductor package. If the total operating current exceeds a predetermined value, a power saving mode of a die of the multi-die semiconductor package may be enabled. Accordingly, by managing the peak current supplied to the semiconductor package, malfunctions of the semiconductor package may be avoided.

As used herein a "logic high" signal is a logic "1" or "on" signal or a signal having a voltage about equal to the logic power of a semiconductor die. As used herein a "logic low" signal is a logic "0" or "off" signal or a signal having a voltage about equal to a logic power common or ground of the semiconductor die (e.g., about 0 V).

FIG. 1 is a schematic diagram illustrating one example of a multi-die semiconductor package 100. Semiconductor package 100 may include an external power supply (VC-CEXT) node 110, a current monitoring node (described below), and a plurality of semiconductor dies $102_0$ to $102_D$, where "D" is any suitable number of semiconductor dies. While the components of semiconductor die $102_0$ are illustrated in FIG. 1 and described below, semiconductor dies $102_1$ to $102_D$ include similar components. Each semiconductor die $102_0$ to $102_D$ may include a first circuit 112, a load 118, a second circuit 120, a monitor pad $124_0$ to $124_D$, a resistance (e.g., a resistor) $128_0$ to $128_D$, and a comparator 134, respectively.

The external power supply node 110 is electrically coupled to the first circuit 112 and the second circuit 120. The first circuit 112 is electrically coupled to the second circuit 120 through a signal path 114 and to the load 118 through an internal power supply (VCCINT) node 116. The second circuit 120 is electrically coupled to monitor pad $124_0$ and to a first input of comparator 134 through a signal path 122. A second input of comparator 134 is electrically coupled to a reference voltage node 132. The output of comparator 134 is electrically coupled to load 118 through a power saving enable signal path 136. Monitor pads $124_0$ to $124_D$ of the semiconductors dies $102_0$ to $102_D$ are electrically coupled to each other via a signal path 126 to provide the current monitoring node. In one example, monitor pads $124_0$ to $124_D$ may be contact pads of the semiconductors dies $102_0$ to $102_D$ that are electrically coupled together via bond wires within the semiconductor package 100. Each monitor pad $124_0$ to $124_D$ is electrically coupled to a first side of a resistance $128_0$ to $128_D$, respectively. The other side of each resistance $128_0$ to $128_D$ is electrically coupled to a common or ground node 130.

The first circuit 112 is configured to supply an operating current to the semiconductor die (e.g., to load 118) from the external power supply node 110. First circuit 112 may include any suitable power supply circuitry, such as a voltage regulator, to supply an internal voltage and current to load 118 through internal power supply node 116. The second circuit 120 is configured to mirror the operating current supplied by first circuit 112 on a reduced scale. Second circuit 120 outputs the mirrored operating current to the current monitoring node (e.g., monitor pads $124_0$ to $124_D$). In one example, the reduced scale is less than $\frac{1}{10}$ such that the mirrored operating current is less than 10% of the operating current. In another example, the reduced scale is $\frac{1}{100}$ such that the mirrored operating current is 1% of the operating current. Since the monitor pads $124_0$ to $124_D$ are electrically coupled together, the mirrored operating current from each semiconductor die $102_0$ to $102_D$ is summed on the current monitoring node. The mirrored operating current from each semiconductor die $102_0$ to $102_D$ may be summed on the current monitoring node such that the current monitoring node indicates a total operating current being supplied to the semiconductor package 100. Resistances $128_0$ to $128_D$ sink the summed mirrored operating currents to provide a voltage on the current monitoring node proportional to the total operating current being supplied to the semiconductor package 100. Resistances $128_0$ to $128_D$ may be sized to provide a voltage on the current monitoring node within a specified range based upon the maximum expected sum of the mirrored operating currents from the semiconductor dies $102_0$ to $102_D$. In one example, resistances $128_0$ to $128_D$ may be adjustable.

The comparator 134 is configured to enable a power saving mode of the semiconductor die in response to the total operating current indicated on the current monitoring node exceeding a reference value. In one example, comparator 134 compares a reference voltage on reference voltage node 132 to the voltage on the current monitoring node. The reference voltage may be selected to set the maximum total operating current allowed before the power saving mode is enabled. In response to the reference voltage being greater than the voltage on the current monitoring node, comparator 134 outputs a first logic level, e.g., a logic low power saving enable signal. In response to the reference voltage being less than the voltage on the current monitoring node, comparator 134 output a second logic level, e.g., a logic high power saving enable signal. In response to the second logic level, e.g., a logic high power saving enable signal, load 118 may enter a power saving mode to reduce the operating current supplied by the first circuit 112 and thus reduce the total operating current supplied to the semiconductor package 100. In one example, the second logic level, e.g., a logic high power saving enable signal may be maintained for a predefined period even if the voltage on the current monitoring nodes falls back below the reference voltage prior to the predefined period elapsing. The predefined period may be selected to prevent excessive oscillations between the power saving mode and the non-power saving mode of load 118. In one example, the predefined period may be adjusted, e.g., by changing a register or trim value of the semiconductor die. In other examples, the predefined period may be at least 2 µs.

Figure 2:
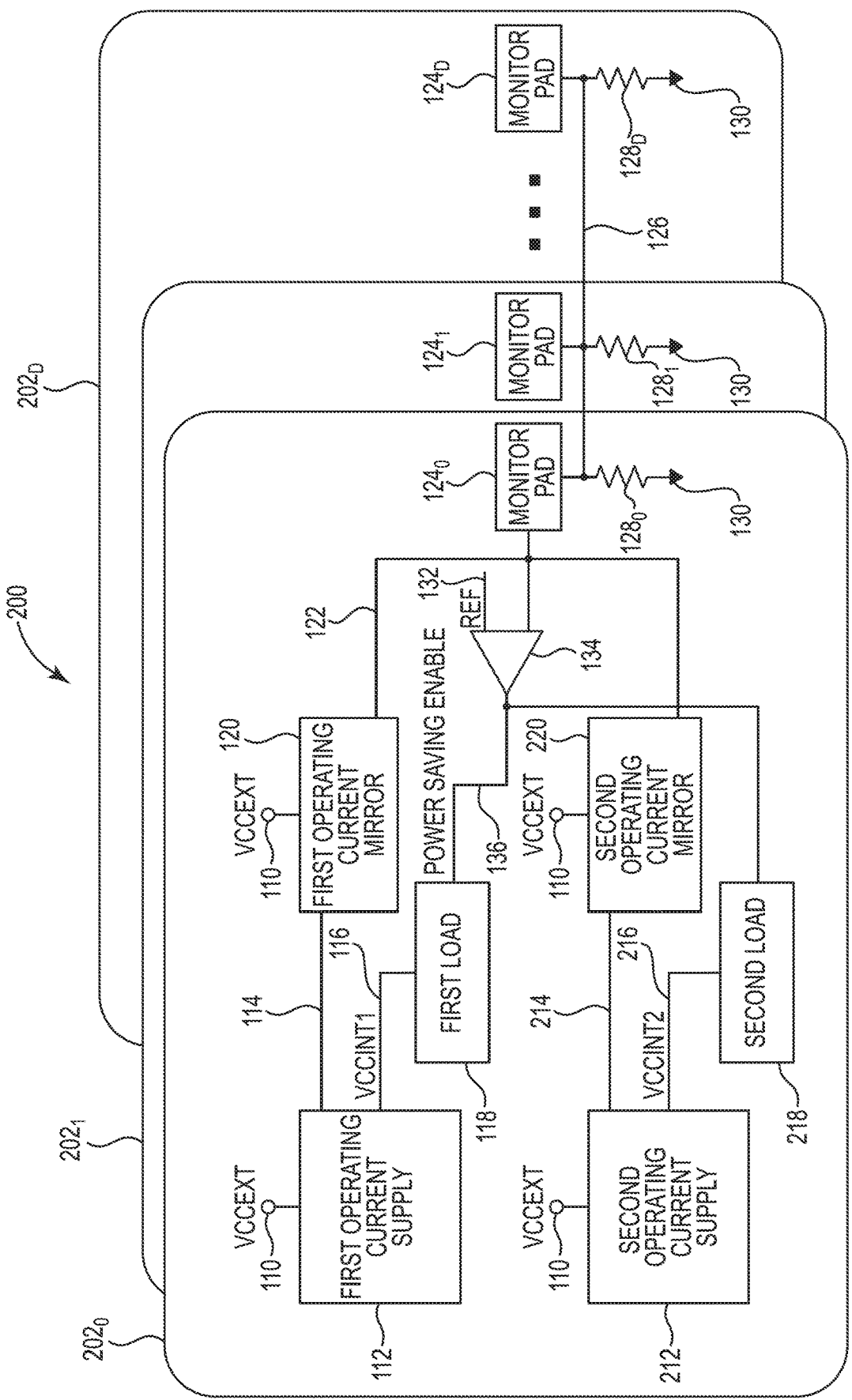
FIG. 2 is a schematic diagram illustrating another example of a multi-die semiconductor package.

FIG. 2 is a schematic diagram illustrating another example of a multi-die semiconductor package 200. Semiconductor package 200 may include an external power supply (VCCEXT) node 110, a current monitoring node (as previously described), and a plurality of semiconductors dies $202_0$ to $202_D$, where "D" is any suitable number of semiconductor dies. While the components of semiconductor die $202_0$ are illustrated in FIG. 2 and described below, semiconductor dies $202_1$ to $202_D$ include similar components. Each semiconductor die $202_0$ to $202_D$ may include a first circuit 112, a first load 118, a second circuit 120, a monitor pad $124_0$ to $124_D$, a resistance $128_0$ to $128_D$, and a comparator 134, respectively, as previously described and illustrated with reference to FIG. 1. In addition, each semiconductor die $202_0$ to $202_D$ may include a third circuit 212, a second load 218, and a fourth circuit 220.

In this example, the first circuit 112 is electrically coupled to the first load 118 through a first internal power supply (VCCINT1) node 116. In addition, the external power supply node 110 is electrically coupled to the third circuit 212 and the fourth circuit 220. The third circuit 212 is electrically coupled to the fourth circuit 220 through a signal path 214 and to the second load 218 through a second internal power supply (VCCINT2) node 216. The fourth circuit 220 is electrically coupled to monitor pad $124_0$ and to the first input of comparator 134 through signal path 122. The output of comparator 134 is electrically coupled to the first load 118 and the second load 218 through power saving enable signal path 136.

The first circuit 112 is configured to supply a first operating current to the semiconductor die (e.g., to first load 118) from the external power supply node 110. The third circuit 212 is configured to supply a second operating current to the semiconductor die (e.g., to second load 218) from the external power supply node 110. Third circuit 212 may include any suitable power supply circuitry, such as a voltage regulator, to supply an internal voltage and current to second load 218 through second internal power supply node 216. The second circuit 120 is configured to mirror the first operating current supplied by first circuit 112 on a reduced scale. The fourth circuit 220 is configured to mirror the second operating current supplied by third circuit 212 on the reduced scale. Second circuit 120 outputs the mirrored first operating current to the current monitoring node (e.g., monitor pads $124_0$ to $124_D$). Fourth circuit 220 outputs the mirrored second operating current to the current monitoring node (e.g., monitor pads $124_0$ to $124_D$). Since the monitor pads $124_0$ to $124_D$ are electrically coupled together, the mirrored first operating current and the mirrored second operating current from each semiconductor die $202_0$ to $202_D$ are summed on the current monitoring node. The mirrored first operating current and the mirrored second operating current from each semiconductor die $202_0$ to $202_D$ may be summed on the current monitoring node such that the current monitoring node indicates a total operating current being supplied to the semiconductor package 200.

As previously described above with reference to FIG. 1, comparator 134 is configured to enable a power saving mode of the semiconductor die in response to the total operating current indicated on the current monitoring node exceeding a reference value. In response to the second logic level, e.g., a logic high power saving enable signal, first load 118 and/or second load 218 may enter a power saving mode to reduce the operating current supplied by the first circuit 112 and/or the third circuit 212 and thus reduce the total operating current supplied to the semiconductor package 200.

Figure 3:
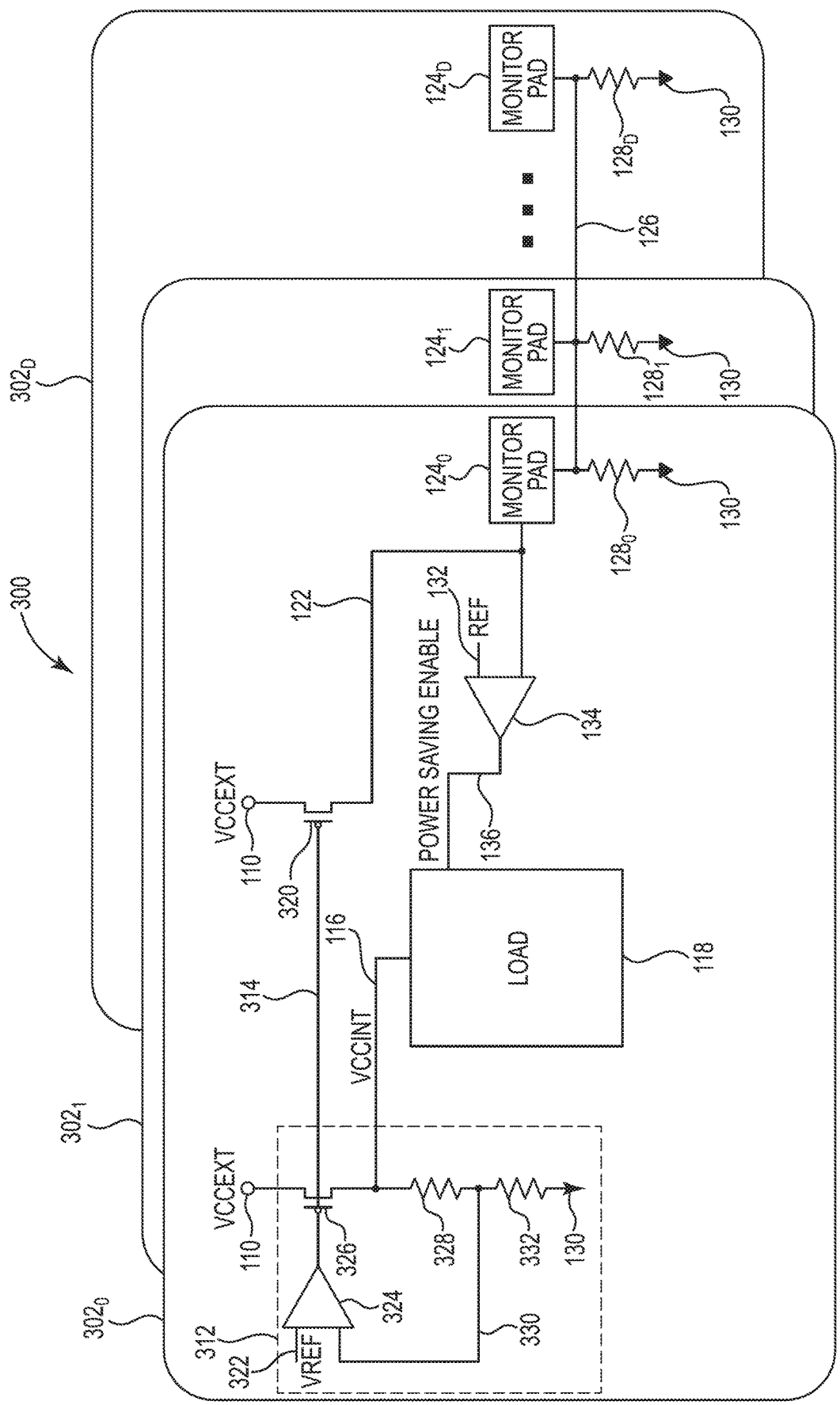
FIG. 3 is a schematic diagram illustrating one example of a multi-die semiconductor package in which each die includes a voltage regulator.

FIG. 3 is a schematic diagram illustrating one example of a multi-die semiconductor package 300 in which each die includes a voltage regulator. Semiconductor package 300 may include an external power supply (VCCEXT) node 110, a current monitoring node (previously described), and a plurality of semiconductors dies $302_0$ to $302_D$, where "D" is any suitable number of semiconductor dies. While the components of semiconductor die $302_0$ are illustrated in FIG. 3 and described below, semiconductor dies $302_1$ to $302_D$ include similar components. Each semiconductor die $302_0$ to $302_D$ may include a voltage regulator 312, a load 118, a current mirror 320, a monitor pad $124_0$ to $124_D$, a resistance $128_0$ to $128_D$, and a comparator 134, respectively.

Voltage regulator 312 may include an amplifier 324, a first transistor (e.g., a pFET)) 326, and resistances (e.g., resistors) 328 and 332. In this example, current mirror 320 is a second transistor (e.g., a pFET). A first input of amplifier 324 is electrically coupled to a reference voltage node 322. The output of amplifier 324 is electrically coupled to the gate of first transistor 326 and the gate of second transistor 320 through a signal path 314. One side of the source-drain path of first transistor 326 is electrically coupled to the external power supply node 110. The other side of the source-drain path of first transistor 326 is electrically coupled to load 118 and one side of resistance 328 through an internal power supply (VCCINT) node 116. The other side of resistance 328 is electrically coupled to a second input of amplifier 324 and one side of resistance 332 through a feedback signal path 330. The other side of resistance 332 is electrically coupled to a common or ground node 130. The source-drain path of second transistor 320 is electrically coupled between the external power supply node 110 and the current monitoring node.

Voltage regulator 312 supplies a regulated internal voltage on internal power supply node 116 based on a reference voltage on reference voltage node 322. First transistor 326 supplies the operating current to load 118 from the external power supply node 110. First transistor 326 has a first width to support the maximum operating current of load 118. Second transistor 320 mirrors the operating current supplied to load 118 by first transistor 326 on a reduced scale. Second transistor 320 outputs the mirrored operating current to the current monitoring node (e.g., monitor pads $124_0$ to $124_D$). Second transistor 320 has a second width less than 10% of the first width of the first transistor 326 such that the reduced scale equals the second width divided by the first width. In one example, the second width is 1% of the first width such that the reduced scale equals 1/100. As previously described above, comparator 134 may enable a power saving mode of the semiconductor die in response to the total operating current indicated on the current monitoring node exceeding a reference value.

Figure 4:
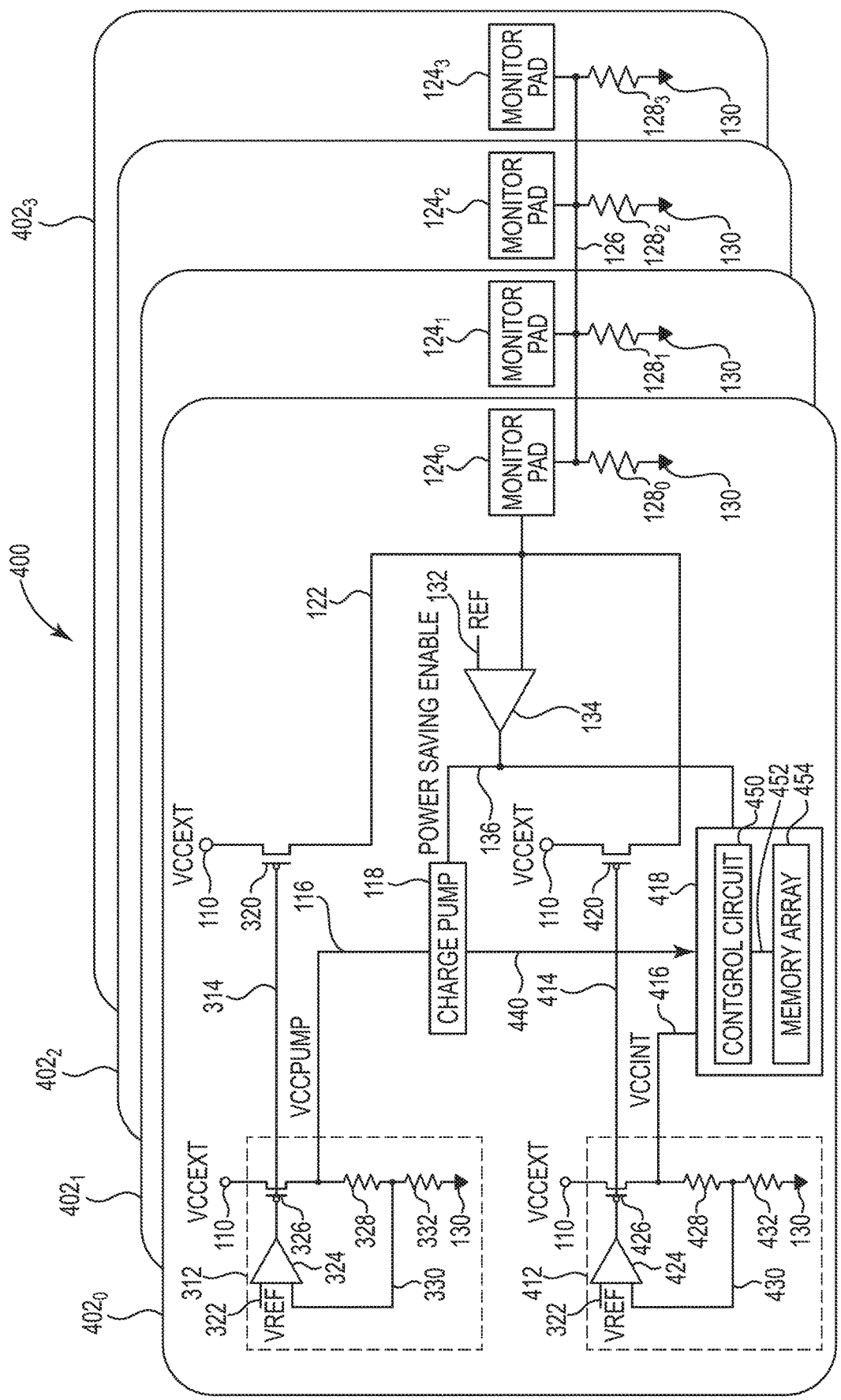
FIG. 4 is a schematic diagram illustrating one example of a memory device.

FIG. 4 is a schematic diagram illustrating one example of a memory device 400. Memory device 400 may include an external power supply (VCCEXT) node 110, a current monitoring node (as previously described), and four semiconductors dies $402_0$ to $402_3$. In other examples, memory device 400 may include a different number of semiconductor dies, such as 8 or 16. While the components of semiconductor die $402_0$ are illustrated in FIG. 4 and described below, semiconductor dies $402_1$ to $402_3$ include similar components. Each semiconductor die $402_0$ to $402_3$ may include a first voltage regulator 312, a first load 118 (e.g., charge pump) 118, a first current mirror 320, a monitor pad $124_0$ to $124_3$, a resistance $128_0$ to $128_3$, and a comparator 134, respectively. In addition, each semiconductor die $402_0$ to $402_3$ may include a second voltage regulator 412, a second load 418, and a second current mirror 420. An output of charge pump 118 may be electrically coupled to second load 418 through a signal path 440. Second load 418 may include a control circuit 450 and a memory array (e.g., NAND memory array) 454. The control circuit 450 may be electrically coupled to the memory array 454 through a signal path 452. The output of comparator 134 is electrically coupled to the charge pump 118 and the control circuit 450 of second load 418 through a power saving enable signal path 136.

Voltage regulator 412 may include an amplifier 424, a third transistor (e.g., a pFET) 426, and resistances (e.g., resistors) 428 and 432. In this example, current mirror 420 is a fourth transistor (e.g., a pFET). A first input of amplifier 424 is electrically coupled to the reference voltage node 322. The output of amplifier 424 is electrically coupled to the gate of third transistor 426 and the gate of fourth transistor 420 through a signal path 414. One side of the source-drain path of third transistor 426 is electrically coupled to the external power supply node 110. The other side of the source-drain path of third transistor 426 is electrically coupled to second load 418 and one side of resistance 428 through an internal power supply (VCCINT) node 416. The other side of resistance 428 is electrically coupled to a second input of amplifier 424 and one side of resistance 432 through a feedback signal path 430. The other side of resistance 432 is electrically coupled to common or ground node 130. The source-drain path of fourth transistor 420 is electrically coupled between the external power supply node 110 and the current monitoring node.

In this example, voltage regulator 312 supplies a regulated internal voltage for charge pump 118 on internal power supply (VCCPUMP) node 116. First transistor 326 supplies a first operating current to the semiconductor die (e.g., to charge pump 118) from the external power supply node 110. Voltage regulator 412 supplies a regulated internal voltage on internal power supply (VCCINT) node 416 based on the reference voltage on reference voltage node 322. Third transistor 426 supplies a second operating current to second load 418 from the external power supply node 110. Third transistor 426 has a third width to support the maximum operating current of second load 418. In one example, the third width of the third transistor 426 equals the first width of the first transistor 326. Fourth transistor 420 mirrors the second operating current supplied to second load 418 by third transistor 426 on a reduced scale. Fourth transistor 420 outputs the mirrored second operating current to the current monitoring node (e.g., monitor pads $124_0$ to $124_4$). Fourth transistor 420 has a fourth width less than 10% of the third width of the third transistor 426 such that the reduced scale equals the fourth width divided by the third width. In one example, the fourth width of the fourth transistor 420 equals the second width of the second transistor 320. In one example, the fourth width is 1% of the third width such that the reduced scale equals 1/100.

As previously described above, comparator 134 is configured to enable a power saving mode of the semiconductor die in response to the total operating current indicated on the current monitoring node exceeding a reference value. Charge pump 118 may be configured to boost a first voltage supplied by the first voltage regulator 312 to supply a second (e.g., boosted) voltage to the memory array 454 for read, program, and erase operations. Charge pump 118 may be configured to reduce the operating current supplied by first transistor 326 in response to the power saving mode being enabled. Control circuit 450 may be configured to reduce the operating current supplied by third transistor 426 in response to the power saving mode being enabled.

Figure 5:
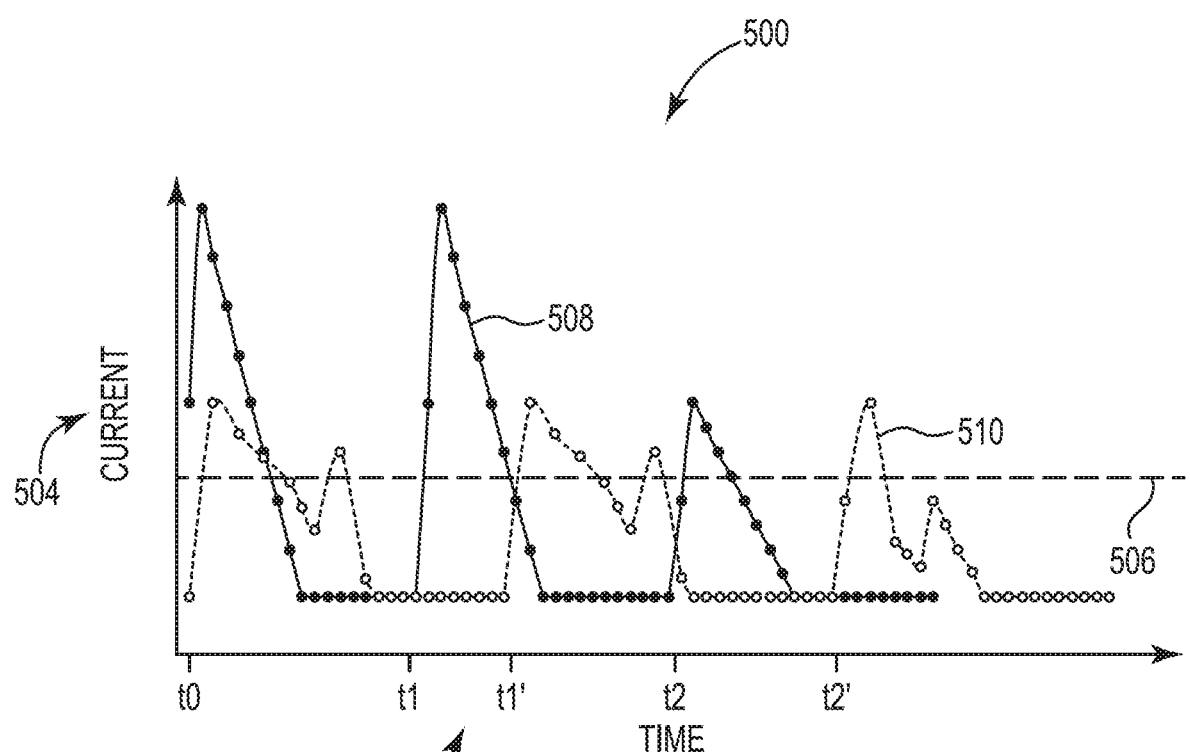
FIG. 5 is a chart depicting one example of peak power management within a semiconductor package.

FIG. 5 is a chart 500 depicting one example of peak power management within a semiconductor package. Chart 500 includes time on the x-axis 502 and operating current on the y-axis 504. The power saving mode of a semiconductor die of the semiconductor package is enabled in response to the total operating current exceeding a threshold current. In this example, the threshold current is indicated at 506. The line 508 indicates one example of the operating current over time for a programing operation (illustrated in FIG. 6) of a memory array without peak power management enabled. The line 510 indicates the operating current over time for the same programming operation of the memory array with peak power management enabled.

As shown in chart 500, each time the operating current exceeds the threshold current, the power saving mode is enabled and the operating current is reduced. The power saving mode is kept in the enabled state for a predefined period. In one example, the predefined period is at least 2 µs. Accordingly, in this example, the peak operating current is reduced by about 40% when peak power management is enabled. Peak power management, however, may extend the time for completing operations such as the programing operation illustrated in FIG. 6.

Figure 6:
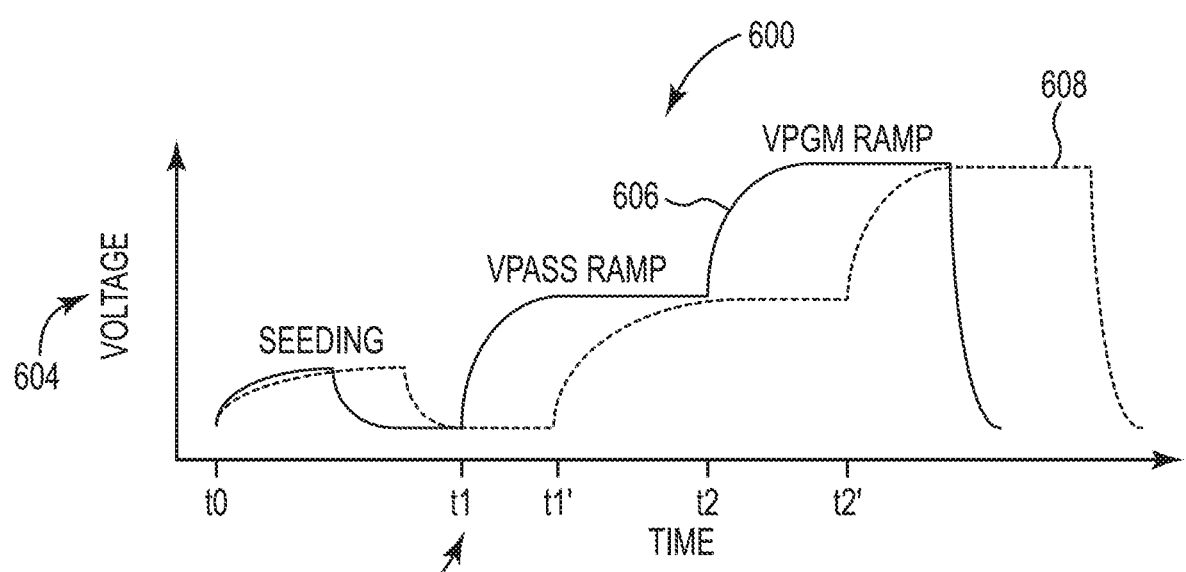
FIG. 6 is a chart depicting one example of peak power management for a programming operation of a memory device.

FIG. 6 is a chart 600 depicting one example of peak power management for a programming operation of a memory device. Chart 600 includes time on x-axis 602 and programming voltage on y-axis 604. The line 606 indicates one example of the programing voltage over time for a programming operation of a memory array without peak power management enabled. The line 608 indicates the programming voltage over time for the same programming operation of the memory array with peak power management enabled. The programming operation includes three stages including a reset stage (e.g., seeding) beginning at t0, a preparing to program stage (e.g., Vpass ramp) beginning at t1 with peak power management disabled and at t1' with peak power management enabled, and a programming stage (e.g., Vpgm ramp) beginning at t2 with peak power management disabled and at t2' with peak power management enabled. As shown in chart 600, with peak power management enabled, the programming operation may become longer.

Figure 7A:
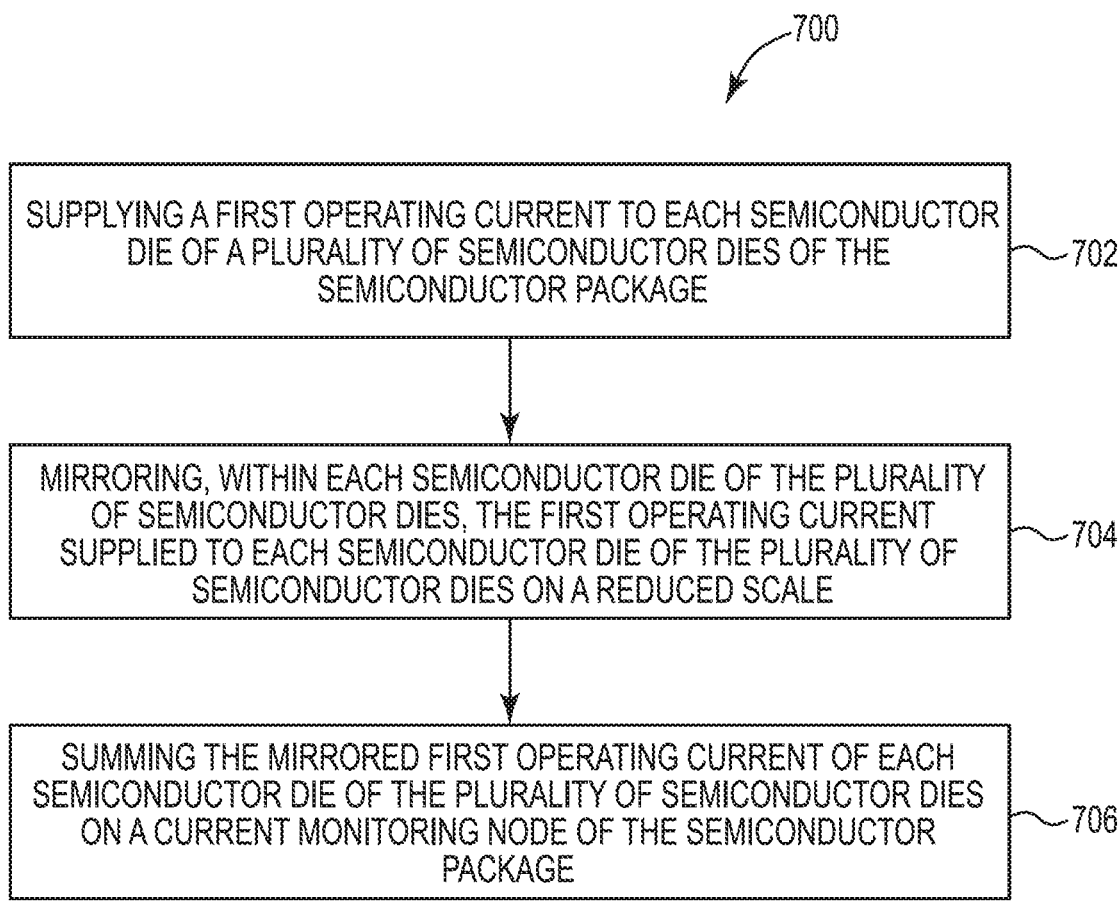
FIGS. 7A-7D are flow diagrams illustrating one example of a method for managing peak power in a semiconductor package.

FIGS. 7A-7D are flow diagrams illustrating one example of a method 700 for managing peak power in a semiconductor package. In one example, method 700 may be implemented by semiconductor package 100, 200, 300, or 400 previously described and illustrated with reference to FIGS. 1-4, respectively. As illustrated in FIG. 7A, at 702 method 700 includes supplying a first operating current to each semiconductor die of a plurality of semiconductor dies of the semiconductor package. In one example, supplying a first operating current to each semiconductor die of the plurality of semiconductor dies comprises supplying a first operating current to a memory array of each semiconductor die of the plurality of semiconductor dies. At 704, method 700 includes mirroring, within each semiconductor die of the plurality of semiconductor dies, the first operating current supplied to each semiconductor die of the plurality of semiconductor dies on a reduced scale. At 706, method 700 includes summing the mirrored first operating current of each semiconductor die of the plurality of semiconductor dies on a current monitoring node of the semiconductor package. In one example, summing the mirrored first operating current of each semiconductor die of the plurality of semiconductor dies comprises summing the mirrored first operating current of each semiconductor die of the plurality of semiconductor dies on the current monitoring node of the semiconductor package such that the current monitoring node indicates a total operating current being supplied to the semiconductor package.

Figure 7B:
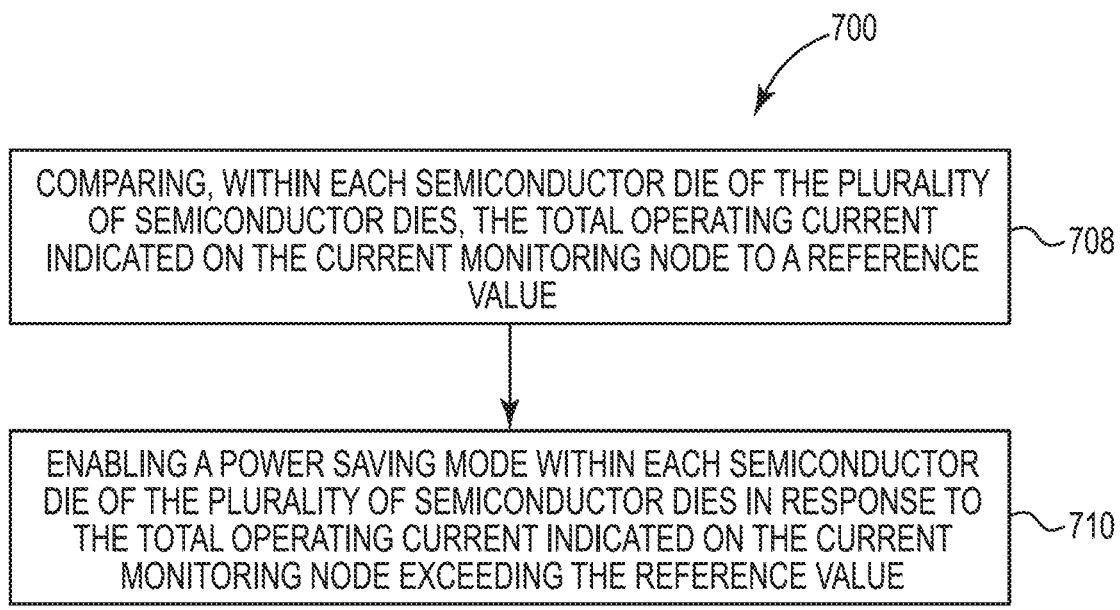
Figure 7C:
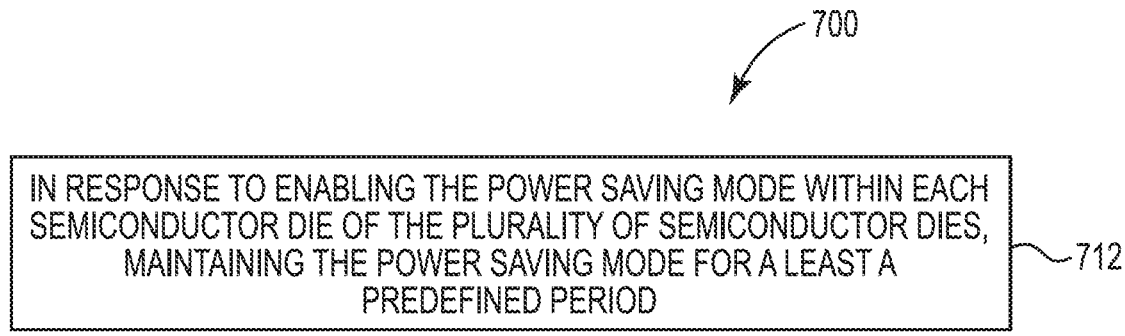

As illustrated in FIG. 7B, at 708 method 700 may further include comparing, within each semiconductor die of the plurality of semiconductor dies, the total operating current indicated on the current monitoring node to a reference value. At 710, method 700 may further include enabling a power saving mode within each semiconductor die of the plurality of semiconductor dies in response to the total operating current indicated on the current monitoring node exceeding the reference value. As illustrated in FIG. 7C, at 712 method 700 may further include in response to enabling the power saving mode within each semiconductor die of the plurality of semiconductor dies, maintaining the power saving mode for at least a predefined period.

Figure 7D:
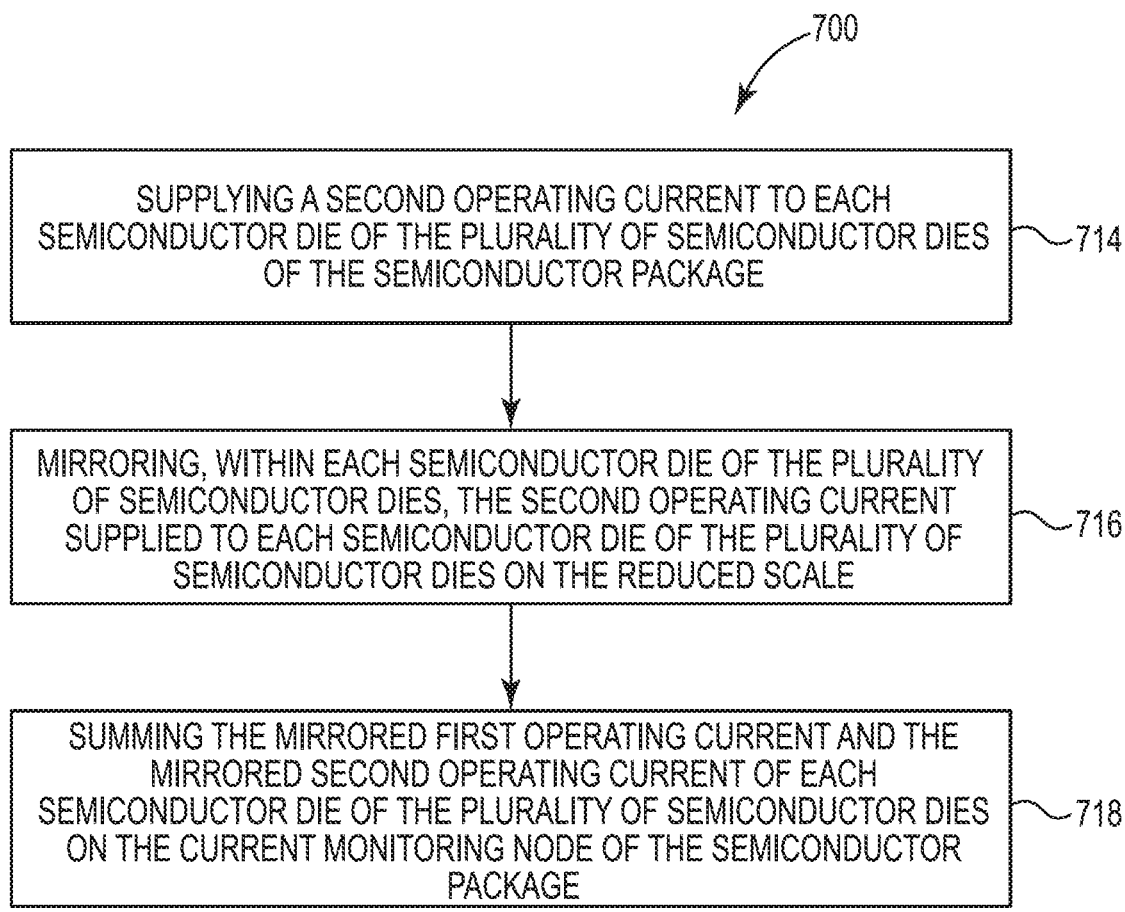

As illustrated in FIG. 7D, at 714 method 700 may further include supplying a second operating current to each semiconductor die of the plurality of semiconductor dies of the semiconductor package. At 716, method 700 may further include mirroring, within each semiconductor die of the plurality of semiconductor dies, the second operating current supplied to each semiconductor die of the plurality of semiconductor dies on the reduced scale. At 718, method 700 may further include summing the mirrored first operating current and the mirrored second operating current of each semiconductor die of the plurality of semiconductor dies on the current monitoring node of the semiconductor package.

Figure 8:
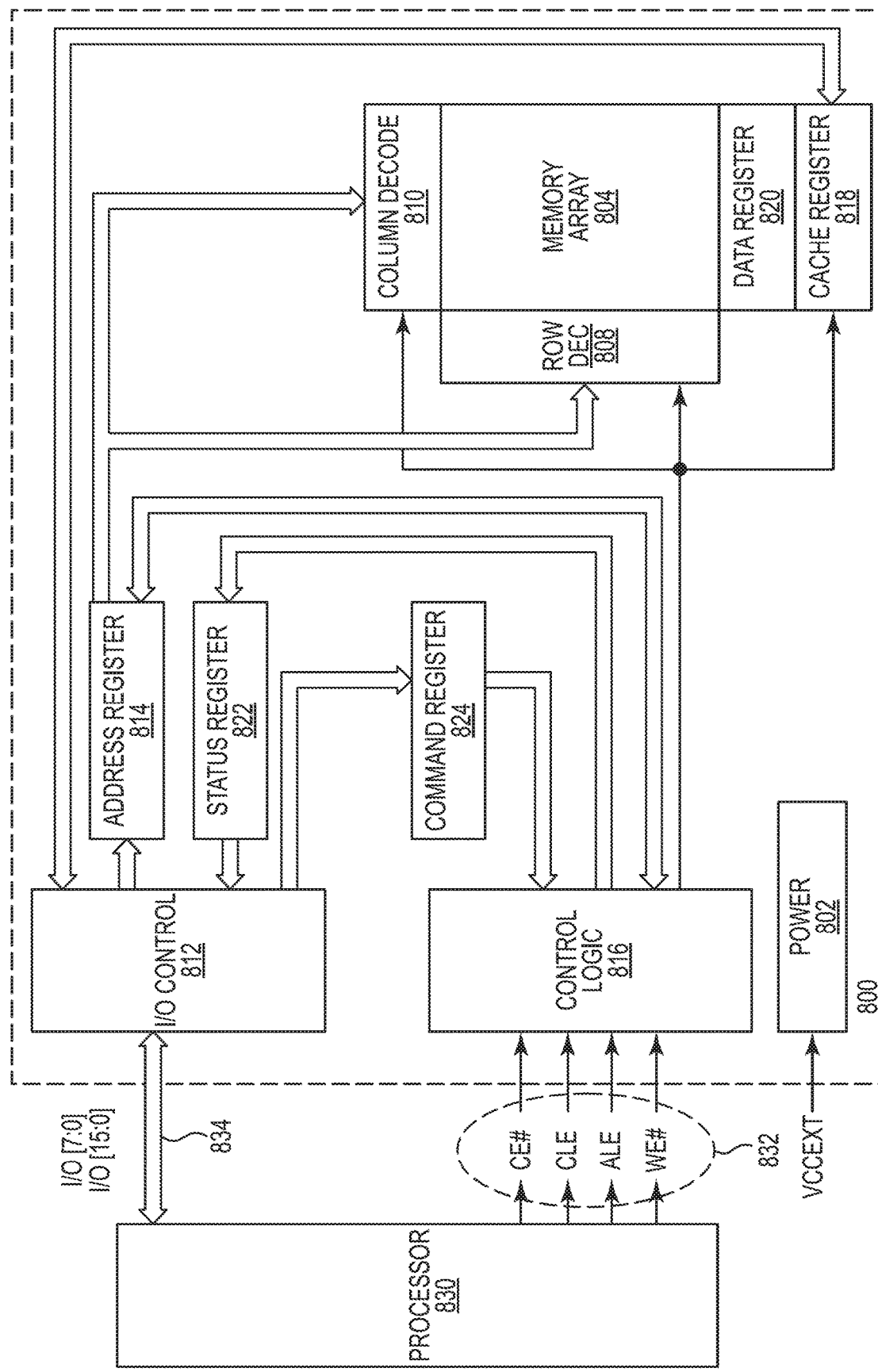
FIG. 8 is a simplified block diagram of one example of a memory device in communication with a processor as part of an electronic system.

FIG. 8 is a simplified block diagram of a first apparatus, in the form of a memory device 800, in communication with a second apparatus, in the form of a processor 830, as part of a third apparatus, in the form of an electronic system, according to an embodiment. Some examples of electronic systems include personal computers, tablet computers, digital cameras, digital media players, digital recorders, games, appliances, vehicles, wireless devices, cellular telephones and the like. The processor 830, e.g., a controller external to the memory device 800, may be a memory controller or other external host device.

Memory device 800 may include the features of memory device 400 of FIG. 4. Memory device 800 includes power circuitry 802. Power circuitry 802 may include the circuitry illustrated in FIG. 4 including a first voltage regulator 312, a charge pump 118, a second voltage regulator 412, a comparator 134, and a current monitoring node for peak power management as previously described above.

Memory device 800 includes an array of memory cells 804 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 8) of at least a portion of array of memory cells 804 are capable of being programmed to one of at least two data states.

A row decode circuitry 808 and a column decode circuitry 810 are provided to decode address signals. Address signals are received and decoded to access the array of memory cells 804. Memory device 800 also includes input/output (I/O) control circuitry 812 to manage input of commands, addresses and data to the memory device 800 as well as output of data and status information from the memory device 800. An address register 814 is in communication with I/O control circuitry 812 and row decode circuitry 808 and column decode circuitry 810 to latch the address signals prior to decoding. A command register 824 is in communication with I/O control circuitry 812 and control logic 816 to latch incoming commands.

An internal controller (e.g., control logic 816) controls access to the array of memory cells 804 in response to the commands and generates status information for the external processor 830, e.g., control logic 816 is configured to perform access operations in accordance with embodiments described herein. The control logic 816 is in communication with row decode circuitry 808 and column decode circuitry 810 to control the row decode circuitry 808 and column decode circuitry 810 in response to the addresses.

Control logic 816 is also in communication with a cache register 818. Cache register 818 latches data, either incoming or outgoing, as directed by control logic 816 to temporarily store data while the array of memory cells 804 is busy writing or reading, respectively, other data. During a program operation (e.g., write operation), data is passed from the cache register 818 to data register 820 for transfer to the array of memory cells 804; then new data is latched in the cache register 818 from the I/O control circuitry 812. During a read operation, data is passed from the cache register 818 to the I/O control circuitry 812 for output to the external processor 830; then new data is passed from the data register 820 to the cache register 818. A status register 822 is in communication with I/O control circuitry 812 and control logic 816 to latch the status information for output to the processor 830.

Memory device 800 receives control signals at control logic 816 from processor 830 over a control link 832. The control signals may include at least a chip enable CE #, a command latch enable CLE, an address latch enable ALE, and a write enable WE #. Additional control signals (not shown) may be further received over control link 832 depending upon the nature of the memory device 800. Memory device 800 receives command signals (which represent commands), address signals (which represent addresses), and data signals (which represent data) from processor 830 over a multiplexed input/output (I/O) bus 834 and outputs data to processor 830 over I/O bus 834.

For example, the commands are received over input/output (I/O) pins [7:0] of I/O bus 834 at I/O control circuitry 812 and are written into command register 824. The addresses are received over input/output (I/O) pins [7:0] of bus 834 at I/O control circuitry 812 and are written into address register 814. The data are received over input/output (I/O) pins [7:0] for an 8-bit device or input/output (I/O) pins [15:0] for a 16-bit device at I/O control circuitry 812 and are written into cache register 818. The data are subsequently written into data register 820 for programming the array of memory cells 804. For another embodiment, cache register 818 may be omitted, and the data are written directly into data register 820. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 8 has been simplified. It should be recognized that the functionality of the various block components described with reference to FIG. 8 may not necessarily be segregated to distinct components or component portions of an integrated circuit device. For example, a single component or component portion of an integrated circuit device could be adapted to perform the functionality of more than one block component of FIG. 8. Alternatively, one or more components or component portions of an integrated circuit device could be combined to perform the functionality of a single block component of FIG. 8.

Additionally, while specific I/O pins are described in accordance with popular conventions for receipt and output of the various signals, it is noted that other combinations or numbers of I/O pins may be used in the various embodiments.

Figure 9A:
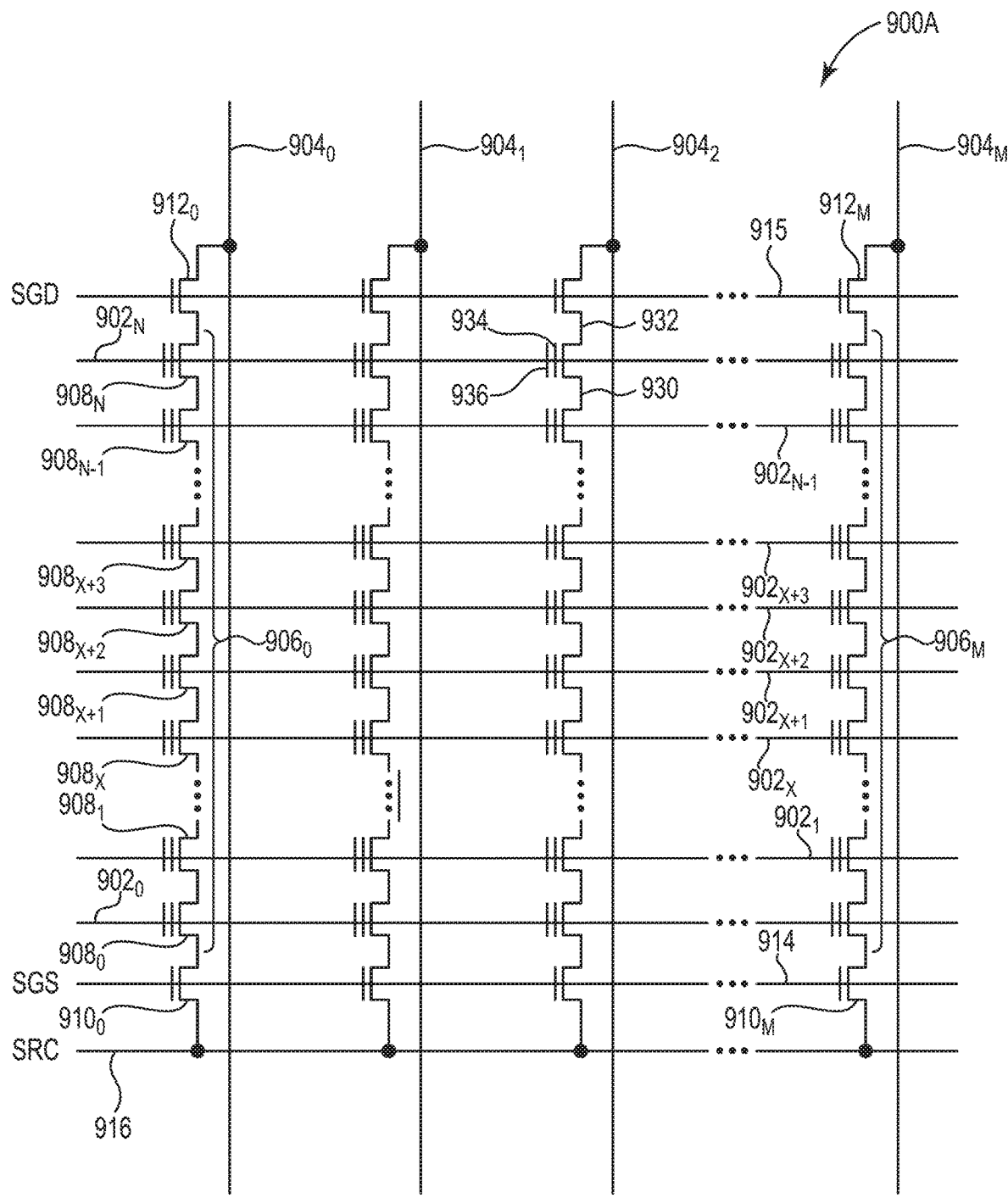
FIG. 9A-9B are schematic diagrams of portions of an array of memory cells as could be used in a memory device of the type described with reference to FIG. 8.

FIG. 9A is a schematic of a NAND memory array 900A, e.g., as a portion of array of memory cells 804. Memory array 900A includes access lines, such as word lines $902_0$ to $902_N$, and data lines, such as bit lines $904_0$ to $904_M$. The word lines 902 may be coupled to global access lines (e.g., global word lines), not shown in FIG. 9A, in a many-to-one relationship. For some embodiments, memory array 900A may be formed over a semiconductor that, for example, may be conductively doped to have a conductivity type, such as a p-type conductivity, e.g., to form a p-well, or an n-type conductivity, e.g., to form an n-well.

Memory array 900A might be arranged in rows (each corresponding to a word line 902) and columns (each corresponding to a bit line 904). Each column may include a string of series-coupled memory cells, such as one of NAND strings $906_0$ to $906_M$. Each NAND string 906 might be coupled to a common source 916 and might include memory cells $908_0$ to $908_N$. The memory cells 908 represent non-volatile memory cells for storage of data. The memory cells 908 of each NAND string 906 might be connected in series between a select transistor 910 (e.g., a field-effect transistor), such as one of the select transistors $910_0$ to $910_M$ (e.g., that may be source select transistors, commonly referred to as select gate source), and a select transistor 912 (e.g., a field-effect transistor), such as one of the select transistors $912_0$ to $912_M$ (e.g., that may be drain select transistors, commonly referred to as select gate drain). Select transistors $910_0$ to $910_M$ might be commonly coupled to a select line 914, such as a source select line, and select transistors $912_0$ to $912_M$ might be commonly coupled to a select line 915, such as a drain select line.

A source of each select transistor 910 might be connected to common source 916. The drain of each select transistor 910 might be connected to the source of a memory cell $908_0$ of the corresponding NAND string 906. For example, the drain of select transistor $910_0$ might be connected to the source of memory cell $908_0$ of the corresponding NAND string $906_0$. Therefore, each select transistor 910 might be configured to selectively couple a corresponding NAND string 906 to common source 916. A control gate of each select transistor 910 might be connected to select line 914.

The drain of each select transistor 912 might be connected to the bit line 904 for the corresponding NAND string 906. For example, the drain of select transistor $912_0$ might be connected to the bit line $904_0$ for the corresponding NAND string $906_0$. The source of each select transistor 912 might be connected to the drain of a memory cell $908_N$ of the corresponding NAND string 906. For example, the source of select transistor $912_0$ might be connected to the drain of memory cell $908_N$ of the corresponding NAND string $906_0$. Therefore, each select transistor 912 might be configured to selectively couple a corresponding NAND string 906 to a corresponding bit line 904. A control gate of each select transistor 912 might be connected to select line 915.

The memory array in FIG. 9A might be a quasi-two-dimensional memory array and might have a generally planar structure, e.g., where the common source 916, strings 906 and bit lines 904 extend in substantially parallel planes.

Alternatively, the memory array in FIG. 9A might be a three-dimensional memory array, e.g., where strings 906 may extend substantially perpendicular to a plane containing the common source 916 and to a plane containing the bit lines 904 that may be substantially parallel to the plane containing the common source 916.

Typical construction of memory cells 908 includes a data-storage structure 934 (e.g., a floating gate, charge trap, etc.) that can determine a data value of the cell (e.g., through changes in threshold voltage), and a control gate 936, as shown in FIG. 9A. Memory cells 908 may further have a defined source 930 and a defined drain 932. Memory cells 908 have their control gates 936 coupled to (and in some cases form) a word line 902.

A column of the memory cells 908 is a NAND string 906 or a plurality of NAND strings 906 coupled to a given bit line 904. A row of the memory cells 908 are memory cells 908 commonly coupled to a given word line 902. A row of memory cells 908 can, but need not include all memory cells 908 commonly coupled to a given word line 902. Rows of memory cells 908 may often be divided into one or more groups of physical pages of memory cells 908, and physical pages of memory cells 908 often include every other memory cell 908 commonly coupled to a given word line 902. For example, memory cells 908 commonly coupled to word line $902_N$ and selectively coupled to even bit lines 904 (e.g., bit lines $904_0$, $904_2$, $904_4$, etc.) may be one physical page of memory cells 908 (e.g., even memory cells) while memory cells 908 commonly coupled to word line $902_N$ and selectively coupled to odd bit lines 904 (e.g., bit lines $904_1$, $904_3$, $904_5$, etc.) may be another physical page of memory cells 908 (e.g., odd memory cells). Although bit lines $904_3$ $904_5$ are not expressly depicted in FIG. 9A, it is apparent from the figure that the bit lines 904 of the array of memory cells 900A may be numbered consecutively from bit line $904_0$ to bit line $904_M$. Other groupings of memory cells 908 commonly coupled to a given word line 902 may also define a physical page of memory cells 908. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Figure 9B:
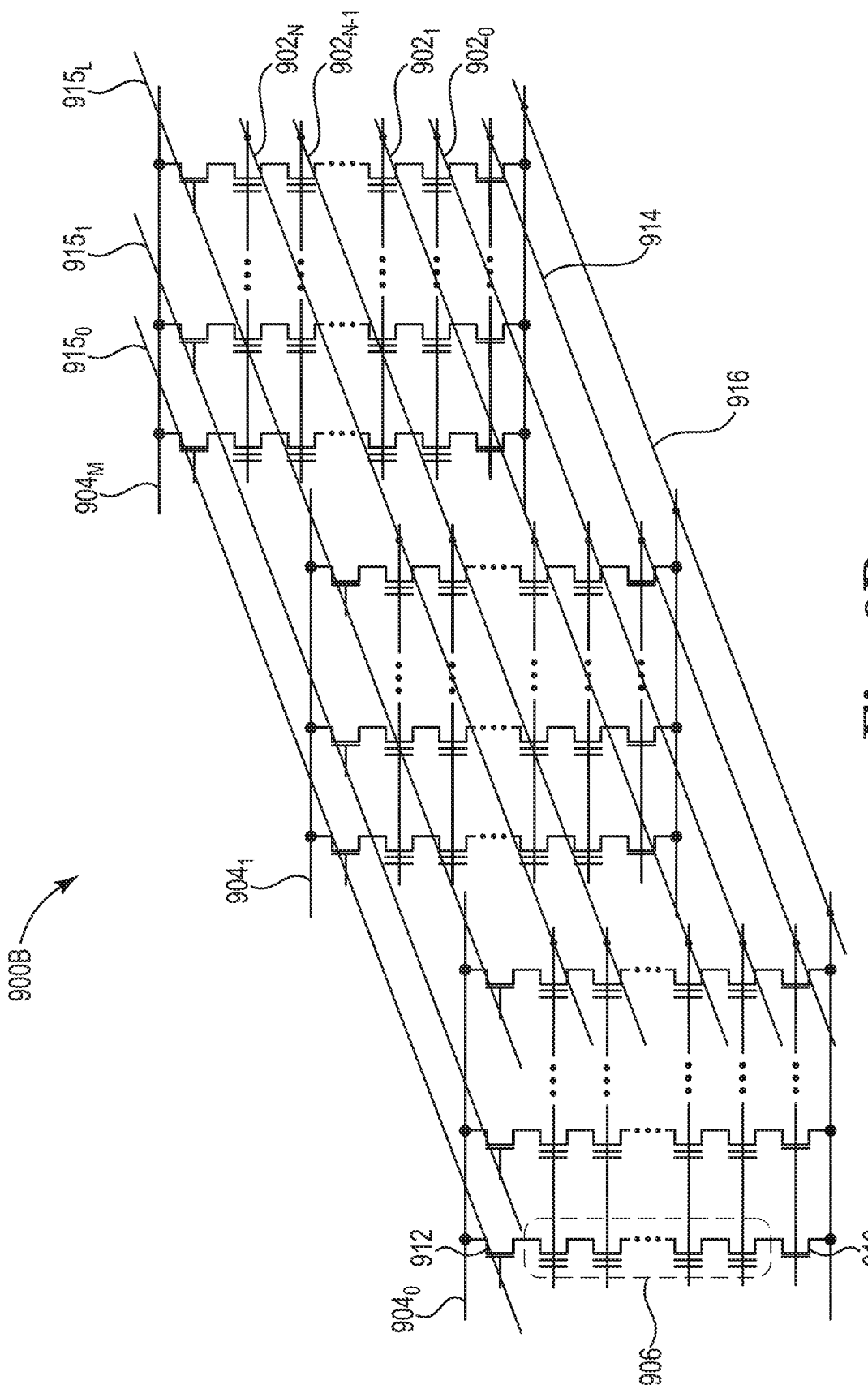

FIG. 9B is another schematic of a portion of an array of memory cells 900B as could be used in a memory of the type described with reference to FIG. 8, e.g., as a portion of array of memory cells 804. Like numbered elements in FIG. 9B correspond to the description as provided with respect to FIG. 9A. FIG. 9B provides additional detail of one example of a three-dimensional NAND memory array structure. The three-dimensional NAND memory array 900B may incorporate vertical structures which may include semiconductor pillars where a portion of a pillar may act as a channel region of the memory cells of NAND strings 906. The NAND strings 906 may be each selectively connected to a bit line $904_0$ to $904_M$ by a select transistor 912 (e.g., that may be drain select transistors, commonly referred to as select gate drain) and to a common source 916 by a select transistor 910 (e.g., that may be source select transistors, commonly referred to as select gate source). Multiple NAND strings 906 might be selectively connected to the same bit line 904. Subsets of NAND strings 906 can be connected to their respective bit lines 904 by biasing the select lines $915_0$ to $915_L$ to selectively activate particular select transistors 912 each between a NAND string 906 and a bit line 904. The select transistors 910 can be activated by biasing the select line 914. Each word line 902 may be connected to multiple rows of memory cells of the memory array 900B. Rows of memory cells that are commonly connected to each other by a particular word line 902 may collectively be referred to as tiers.

Although the examples of FIGS. 9A-9B are discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A semiconductor package comprising:
    an external power supply node;
    a current monitoring node; and
    a plurality of semiconductor dies, each semiconductor die of the plurality of semiconductor dies comprising:
        a first circuit configured to supply a first operating current to that semiconductor die from the external power supply node; and
        a second circuit configured to mirror the first operating current on a reduced scale and output the mirrored first operating current to the current monitoring node;
    wherein the mirrored first operating current from each semiconductor die of the plurality of semiconductor dies is summed on the current monitoring node.

2. The semiconductor package of claim 1, wherein the mirrored first operating current from each semiconductor die of the plurality of semiconductor dies is summed on the current monitoring node such that the current monitoring node indicates a total operating current being supplied to the semiconductor package.

3. The semiconductor package of claim 2, wherein each semiconductor die of the plurality of semiconductor dies further comprises a comparator configured to enable a power saving mode of that semiconductor die in response to the total operating current indicated on the current monitoring node exceeding a reference value.

4. The semiconductor package of claim 1, wherein each semiconductor die of the plurality of semiconductor dies further comprises:
    a third circuit configured to supply a second operating current to that semiconductor die from the external power supply node; and
    a fourth circuit configured to mirror the second operating current on the reduced scale and output the mirrored second operating current to the current monitoring node,
    wherein the mirrored first operating current and the mirrored second operating current from each semiconductor die of the plurality of semiconductor dies are summed on the current monitoring node.

5. The semiconductor package of claim 1, wherein the first circuit comprises a first transistor to supply the first operating current, the first transistor having a first width, and wherein the second circuit comprises a second transistor directly electrically coupled to the first transistor, the second transistor having a second width less than 10 percent of the first width such that the reduced scale equals the second width divided by the first width.

6. The semiconductor package of claim 5, wherein the first transistor is directly electrically coupled to the external power supply node, and
wherein the second transistor is directly electrically coupled to the external power supply node.

7. The semiconductor package of claim 1, wherein the reduced scale equals 1/100.

8. The semiconductor package of claim 1, wherein the first circuit of each semiconductor die of the plurality of semiconductor dies comprises a voltage regulator.

9. A memory device comprising:
an external power supply node;
a current monitoring node; and
a plurality of semiconductor dies, each semiconductor die of the plurality of semiconductor dies comprising:
  a memory array;
  a first voltage regulator configured to supply a first operating current to the memory array from the external power supply node; and
  a first current mirror configured to mirror the first operating current on a reduced scale and output the mirrored first operating current to the current monitoring node;
wherein the mirrored first operating current from each semiconductor die of the plurality of semiconductor dies is summed on the current monitoring node such that the current monitoring node indicates a total operating current being supplied to the memory device.

10. The memory device of claim 9, wherein each semiconductor die of the plurality of semiconductor dies further comprises a comparator configured to enable a power saving mode of that semiconductor die in response to the total operating current indicated on the current monitoring node exceeding a reference value.

11. The memory device of claim 10, wherein each semiconductor die of the plurality of semiconductor dies further comprises a charge pump configured to boost a first voltage supplied by the first voltage regulator to supply a second voltage to the memory array for read, program, and erase operations,
wherein the charge pump is configured to reduce the first operating current in response to the power saving mode being enabled.

12. The memory device of claim 10, wherein each semiconductor die of the plurality of semiconductor dies further comprises a control circuit electrically coupled to the memory array,
wherein the control circuit is configured to reduce the first operating current in response to the power saving mode being enabled.

13. The memory device of claim 9, wherein each semiconductor die of the plurality of semiconductor dies further comprises:
a second voltage regulator configured to supply a second operating current to the memory array from the external power supply node; and
a second current mirror configured to mirror the second operating current on the reduced scale and output the mirrored second operating current to the current monitoring node,
wherein the mirrored first operating current and the mirrored second operating current from each semiconductor die of the plurality of semiconductor dies are summed on the current monitoring node.

14. The memory device of claim 9, wherein the first voltage regulator comprises a first transistor to supply the first operating current, the first transistor having a first width, and
wherein the first current mirror comprises a second transistor directly electrically coupled to the first transistor, the second transistor having a second width less than 10 percent of the first width such that the reduced scale equals the second width divided by the first width.

15. The memory device of claim 14, wherein the first transistor is directly electrically coupled to the external power supply node, and
wherein the second transistor is directly electrically coupled to the external power supply node.

16. The memory device of claim 9, wherein each semiconductor die of the plurality of semiconductor dies further comprises:
a resistance electrically coupled to the current monitoring node; and
a comparator having a first input electrically coupled to the current monitoring node, a second input electrically coupled to a reference voltage node, and an output electrically coupled to a power saving enable signal node.

17. The memory device of claim 9, wherein the reduced scale equals 1/100.

18. The memory device of claim 9, wherein the memory array of each semiconductor die of the plurality of semiconductor dies comprises a NAND memory array.

19. A method for managing peak power in a semiconductor package, the method comprising:
supplying a first operating current to each semiconductor die of a plurality of semiconductor dies of the semiconductor package;
mirroring, within each semiconductor die of the plurality of semiconductor dies, the first operating current supplied to each semiconductor die of the plurality of semiconductor dies on a reduced scale; and
summing the mirrored first operating current of each semiconductor die of the plurality of semiconductor dies on a current monitoring node of the semiconductor package.

20. The method of claim 19, wherein summing the mirrored first operating current of each semiconductor die of the plurality of semiconductor dies comprises summing the mirrored first operating current of each semiconductor die of the plurality of semiconductor dies on the current monitoring node of the semiconductor package such that the current monitoring node indicates a total operating current being supplied to the semiconductor package.

21. The method of claim 20, further comprising:
comparing, within each semiconductor die of the plurality of semiconductor dies, the total operating current indicated on the current monitoring node to a reference value; and
enabling a power saving mode within each semiconductor die of the plurality of semiconductor dies in response to the total operating current indicated on the current monitoring node exceeding the reference value.

22. The method of claim 21, further comprising:
in response to enabling the power saving mode within each semiconductor die of the plurality of semiconductor dies, maintaining the power saving mode for at least a predefined period.

23. The method of claim 19, further comprising:
supplying a second operating current to each semiconductor die of the plurality of semiconductor dies of the semiconductor package;
mirroring, within each semiconductor die of the plurality of semiconductor dies, the second operating current supplied to each semiconductor die of the plurality of semiconductor dies on the reduced scale; and
summing the mirrored first operating current and the mirrored second operating current of each semiconductor die of the plurality of semiconductor dies on the current monitoring node of the semiconductor package.

24. The method of claim 19, wherein supplying a first operating current to each semiconductor die of the plurality of semiconductor dies comprises supplying a first operating current to a memory array of each semiconductor die of the plurality of semiconductor dies.

* * * * *